United States Patent [19]
Atwood et al.

[11] Patent Number: 5,390,146
[45] Date of Patent: Feb. 14, 1995

[54] REFERENCE SWITCHING CIRCUIT FOR FLASH EPROM

[75] Inventors: Gregory E. Atwood, San Jose; Owen W. Jungroth, Sonora, both of Calif.

[73] Assignee: Intel Corporation, Santa Clara, Calif.

[21] Appl. No.: 192,182

[22] Filed: Feb. 3, 1994

Related U.S. Application Data

[63] Continuation of Ser. No. 863,147, Apr. 2, 1992, abandoned, which is a continuation of Ser. No. 638,338, Jan. 4, 1991, abandoned, which is a continuation of Ser. No. 365,185, Jun. 12, 1989, abandoned.

[51] Int. Cl.⁶ .................... G11C 11/34; G11C 7/02
[52] U.S. Cl. ........................ 365/185; 365/207; 365/210; 365/218
[58] Field of Search ............ 365/184, 185, 207, 210, 365/218

[56] References Cited

U.S. PATENT DOCUMENTS

| | | | |
|---|---|---|---|
| 4,301,518 | 10/1981 | Klaas | 365/207 X |
| 4,698,787 | 10/1987 | Mukherjee et al. | 365/185 |
| 4,713,797 | 12/1987 | Morton et al. | 365/185 X |
| 4,879,682 | 11/1989 | Engles | 365/207 X |
| 4,888,738 | 12/1989 | Wong et al. | 365/218 |

FOREIGN PATENT DOCUMENTS 0377840  7/1990  European Pat. Off. .

*Primary Examiner*—Jack B. Harvey
*Assistant Examiner*—Michael A. Whitfield
*Attorney, Agent, or Firm*—Blakely, Sokoloff, Taylor & Zafman

[57] ABSTRACT

A circuit for switching the source regions of reference devices used in a flash EPROM from ground potential to a potential of 3.5 volts during programming. This prevents charging of the floating gates of the reference devices on the selected word line and the discharging of the floating gates of the reference devices on the non-selected word lines.

17 Claims, 2 Drawing Sheets

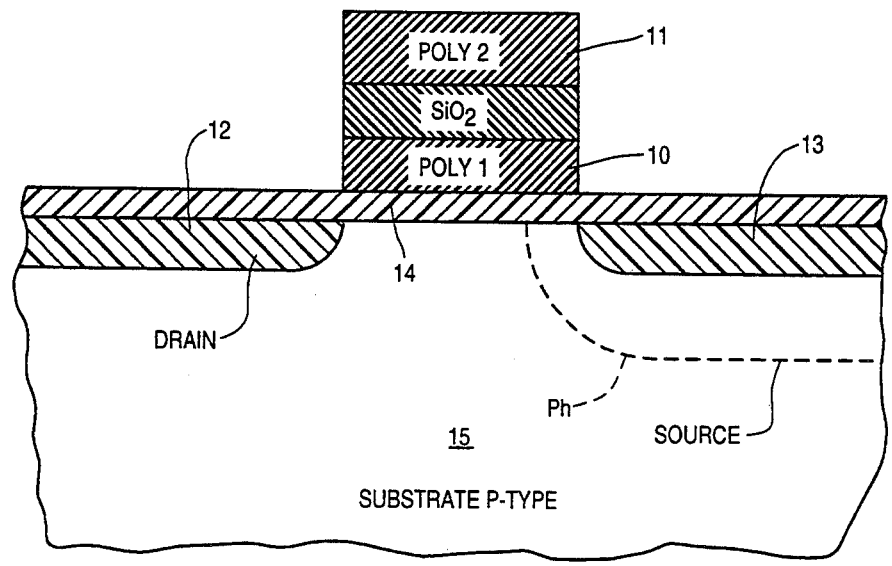
FIG_1 (PRIOR ART)
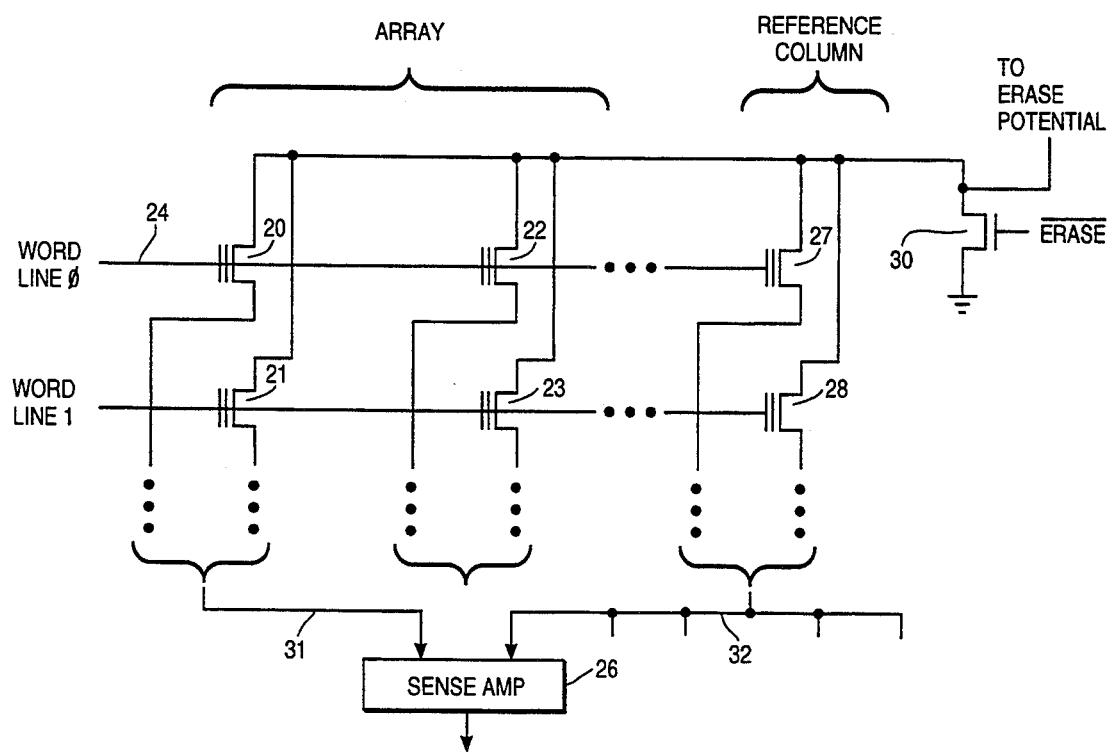
FIG_2 (PRIOR ART)

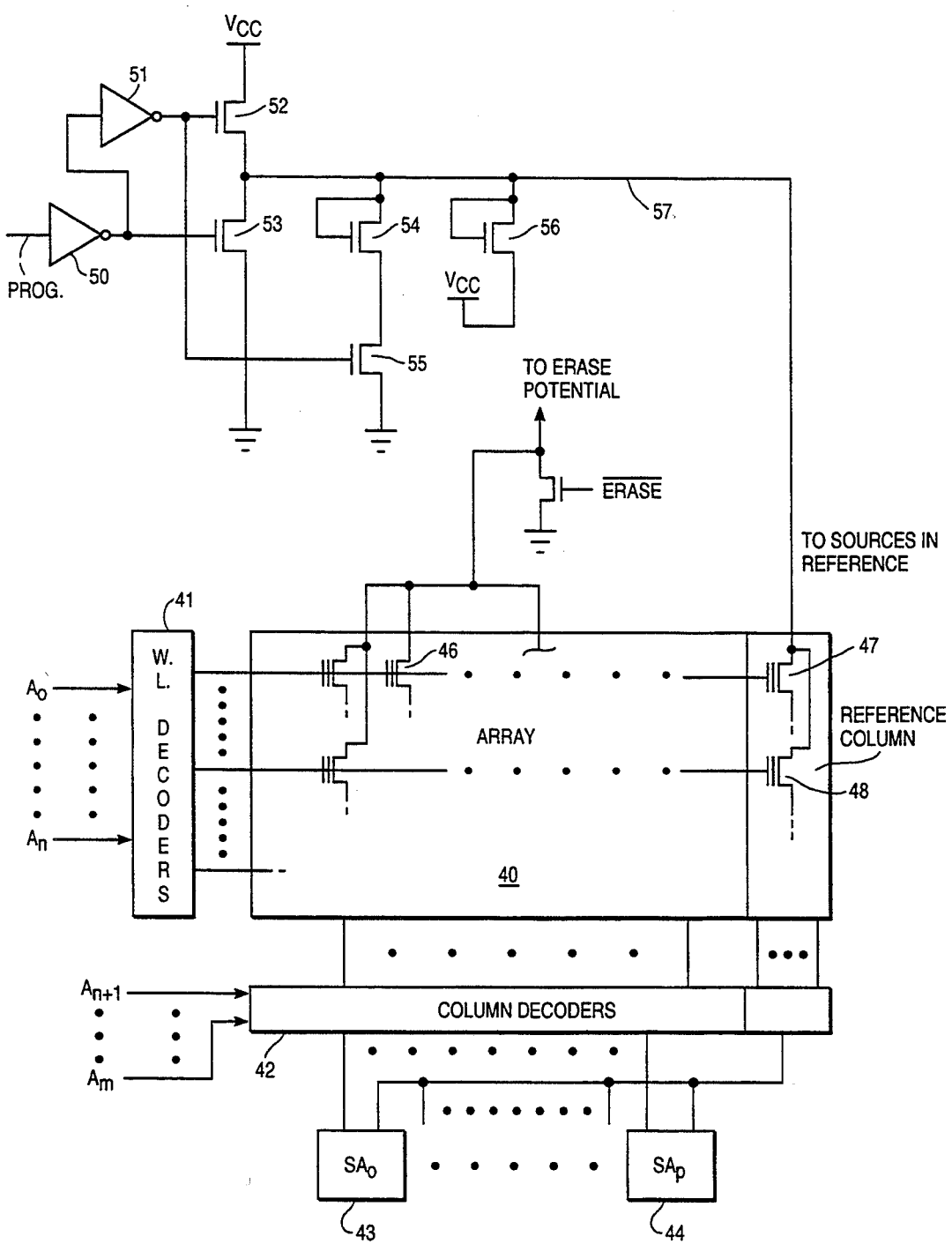
FIG_3

REFERENCE SWITCHING CIRCUIT FOR FLASH EPROM

This is a continuation of application Ser. No. 07/863,147, filed Apr. 2, 1992, now abandoned, which is a continuation of application Ser. No. 07/638,338, filed Jan. 4, 1991, now abandoned, which is a continuation of application Ser. No. 07/365,185, filed on Jun. 12, 1989, now abandoned.

BACKGROUND OF THE INVENTION

1. Field of the Invention

The invention relates to the field of electrically programmable read-only memories, particularly those employing floating gate memory devices.

2. Prior Art

Metal-oxide-semiconductor (MOS) electrically programmable read-only memories (EPROMs) frequently use memory cells that have electrically isolated gates (floating gates). These floating gates are typically completely surrounded by oxide and formed from a polycrystalline silicon (polysilicon) layer. Information is stored in the memory cells or devices in the form of charge on the floating gates. Charge is transported to the floating gates by a variety of mechanisms such as avalanche injection, channel injection, tunnelling, etc., depending on the construction of the cells. The cells are erased generally by exposing the array to ultraviolet radiation. An example of these cells can be found in U.S. Pat. Nos. 3,500,142; 3,660,819; 3,755,721; and 4,099,196. In some cases these cells am electrically erasable (EEPROM). An example of such a cell is shown in U.S. Pat. No. 4,203,158.

The invention of the present application is used with an EPROM cell particularly one which is electrically erasable, referred to as a "flash" EPROM cell. The cell used in conjunction with the present invention is described in copending application Ser. No. 253,775, entitled Low Voltage EEPROM Cell, filed Oct. 5, 1988, and assigned to the assignee of the present invention.

It has been known for many years that when EPROM cells am used in a memory array, circuitry is sometimes required to electrically isolate the devices, one from the other. This may be needed, for example, to permit the reading of one cell without interference from adjacent cells, or for instance, to permit the programming of a cell without disturbing the programming of another cell. For examples of this, see U.S. Pat. Nos. 3,728,695 and 4,698,787.

A variety of sense amplifiers are used in the prior art to sense the state of cells. One category of these amplifiers relies on a reference potential developed by a dummy or reference cell. An example of this type of sense amplifier is shown in U.S. Pat. No. 4,223,394.

As will be seen, the present invention provides isolation of sorts, in a flash EPROM memory array. However, with the present invention, this isolation is used for the reference cells or devices used in the array as part of the sensing circuitry.

SUMMARY OF THE INVENTION

An improvement in electrically programmable memory arrays employing memory devices having electrically floating gates is described. A switch is coupled to one region of a reference device; this device is used to establish a reference potential during the reading of the states of the memory devices. The switch decouples the region of the reference device from a first potential and couples the region to a second potential during programming. In the currently preferred embodiment, the source region of the reference device is coupled to ground during read cycles. However, during programming the source region is coupled to a potential of approximately 3.5 volts. This prevents a disturb condition in the reference device which would otherwise cause the floating gate of the reference device to become charged.

Other aspects of the present invention will become apparent from the following description.

BRIEF DESCRIPTION OF THE DRAWINGS

FIG. 1 is a cross-sectional elevation view of a floating gate memory device or cell used in the currently preferred embodiment of the invention.

FIG. 2 shows an array arrangement utilizing the memory devices of FIG. 1 without the present invention. This figure is used to describe the problem solved by the present invention.

FIG. 3 is an electrical schematic showing the presently preferred embodiment of the invention and its coupling to a memory array.

DETAILED DESCRIPTION OF THE PRESENT INVENTION

A circuit for preventing a disturb condition in reference devices for an electrically programmable memory array is described. In the following description, numerous specific details are set forth such as a specific electrical schematic in order to provide a thorough understanding of the present invention. It will, however, be obvious to one skilled in the art that the present invention may be practiced without these specific details. In other instances, well-known processes or well-known circuits have not been described in detail in order not to unnecessarily obscure the present invention.

Referring to FIG. 1, the memory device or cell used with the present invention is formed in a silicon substrate such as the p-type substrate 15 of FIG. 1. (The device of FIG. 1 is shown in a partially fabricated state since this best reveals its structure.) The device includes a pair of spaced-apart regions disposed in the substrate specifically a drain region 12 and a source region 13. A polysilicon floating gate 10 is generally disposed between these regions and insulated from these regions by a layer of silicon dioxide or other insulative layer 14. The floating gate 10 at the completion of the processing is completely surrounded by an oxide layer and hence, floats electrically. A second gate (control gate 11 ) is disposed above the floating gate 10; in the presently preferred embodiment this gate is fabricated from a second layer of polysilicon. This control gate is a continuous polysilicon strip forming a word line in the integrated circuit arrays of FIGS. 2 and 3.

The memory device of the presently preferred embodiment uses asymmetrically doped source and drain regions. The source and drain regions are both doped with an arsenic dopant and the source region is additionally doped with a phosphorous dopant. Hence, the source region is more deeply doped and additionally the source region overlaps the overlying floating gate.

It will be appreciated that the cell of FIG. 1 may be fabricated using well-known NMOS technology or CMOS technology. The n-channel device illustrated in FIG. 1 may be fabricated directly in a p-type substrate or when an n-type substrate is used may be fabricated in a p-type well formed in the substrate. Other such well-known variations such as employing both p-wells and n-wells are well-known in the art.

As currently employed, the memory devices are programmed (i.e., negatively charging the floating gate) by coupling the word line or control gate 11 to a potential of approximately +12 volts, the drain region to approximately +7 volts, and the source region to ground. With these conditions, channel hot electron injection occurs through the oxide layer 14 which layer is approximately 115Å thick in the currently preferred embodiment. To erase the cell, the drain region is floated, the word line or control gate 11 is grounded and a potential of approximately +12 volts is applied to the source region. Under these conditions, charge is tunnelled from the floating gate. During reading of the cell, a positive potential less than that which would cause charge to transfer onto the floating gate is applied to the control gate and a potential (e.g., 1 volt) is applied to the drain region. Current through the device is sensed to determine if the floating gate is or is not negatively charged. As with other floating gate devices, the negative charge on the floating gate shifts the threshold voltage of the device making it less conductive. Thus, with a sense amplifier the presence or absence of charge on the floating gate can be determined.

An integrated circuit array utilizing the memory devices of FIG. 1 is illustrated in FIG. 2. The memory devices are shown as devices 20, 21, 22 and 23. Word line 24 (the control gate of the devices) extends over device 20 and device 22 and over the other devices in the row. Similarly, a word line is associated with devices 21 and 23. Through ordinary decoding means a word line in the array is selected through a row decoder and a column in the array is selected through a column decoder. This couples a cell through line 31 to a sense amplifier 26.

In the currently preferred embodiment, a column of dummy or reference devices is employed with two of the devices 27 and 28 being illustrated in FIG. 2. Each of these devices are identical in terms of structure and size to the memory devices. The word line 24 extends to and is part of the device 27 and similarly, the word line 1 extends to and is part of the device 28. When the word line 24 is selected, the device 27 is selected and a reference potential from device 27 is coupled to the sense amplifier 26 through line 32. This reference potential is used in a differential amplifier as is commonly done with EPROMs and other memories. During reading and programming, the source regions of all the devices are coupled to ground through transistor 30. During erasing, transistor 30 decouples the source regions from ground, allowing the erased potential to be applied to the source regions of all the devices.

The number of reference devices used in array can vary, although in the currently preferred embodiment, a column of these devices is used. It is possible, for instance, to use a single reference device for the entire array, or for a plurality of columns of reference devices to be used, for example, one column for each of eight I/Os of a memory device. As illustrated by line 32, where a single reference column is used, the potential developed by the selected reference device is coupled to other sense amplifiers where the array is organized, for instance, as a "X8". Obviously, additional sense amplifiers are used for this organization. As is known, the reference devices have characteristics which are substantially the same as the memory devices since they are formed on the same substrate. These reference devices compensate for process, temperature and voltage variations.

Assume that the devices along word line 24 are to be programmed and hence, the word line 24 is brought to 12 volts. The line 24 may remain at 12 volts for a relatively long period of time while the various devices along the word line are programmed. During this programming, the drain region of device 27 is not coupled to a positive potential, hence, current does not flow through device 27. This prevents the floating gate of device 27 from rapidly charging. However, the floating gate of device 27 tends to slowly charge because of the relatively high potential on the word line. Where the array is designed for many cycles of programming and erasing (e.g., 10,000) the floating gate of device 27 might become charged sufficiently to destroy its value as a reference element to the sense amplifier.

To prevent this from happening in the present invention, the source regions of the reference devices are decoupled from ground during programming. The source regions, for example, could be coupled to +5 volts during programming.

It has been found, however, that coupling the source region to +5 volts creates yet another disturb condition. Again, referring to FIG. 2, the +5 volts on the source regions of the reference devices causes a disturbance in the reference devices on the non-selected word lines. With the gates of the non-selected word lines grounded, and the source region at, for instance, +5 volts, slow erasing occurs. This pulls off electrons from the floating gate of the reference devices causing the gates to become positively charged. Positively charged floating gates would also prevent the reference devices from performing well as references devices. It has been found that a balance must be struck during programming between a high source region voltage (e.g., +5 volts) and ground. In the currently preferred embodiment, it has been determined that a voltage of approximately 3.5 volts applied to the source regions during programming is high enough to prevent charging of the floating gates of the selected lines and yet low enough to prevent slow erasing of the floating gates along the non-selected lines.

Referring to FIG. 3, an array 40 is shown which includes a plurality of memory devices (e.g., device 46) each of which is the same as the devices of FIG. 1. Word lines in the array am selected by word line decoder 41. Column lines are selected through column decoders 42 allowing columns to be coupled to the sense amplifiers. (Sense amplifiers 43 and 44 are shown in FIG. 3.) The sense amplifiers also receive a potential from the reference device associated with the selected word line, such as potentials from reference devices 47 and 48. For instance, if the word line associated with device 46 is selected, memory devices along this word line are coupled to the sense amplifiers along with a reference potential from device 47.

The source regions of all the reference devices are coupled to line 57. During non-programming operations, the input to inverter 50 is low, hence, the output of this inverter is high causing the n-channel transistor 53 to conduct. This couples line 57 to ground. When the programming potential is high (i.e., during programming) transistor 53 does not conduct and the output of inverter 51 causes transistor 52 to conduct. The potential then on line 57 during programming is $V_{cc}$, less the threshold drop of transistor 52 or approximately 3.5 volts in the currently preferred embodiment. Transistor 56 prevents bootstrapping from occurring, clamping line 57 to a value no higher than $V_{cc}+V_{TN}$. If bootstrapping does occur, the weak pull-down from transistors 54 and 55 causes leakage on line 57 bringing the potential on line 57 back to the desired 3.5 volts.

Thus, a circuit has been described which provides switching of the source regions of reference devices used in a flash EPROM.

We claim:

1. In an electrically programmable read-only memory array employing memory devices having electrically floating gates and first and second regions, wherein said memory devices are arranged in rows and the floating gates of said memory devices in each of said rows are coupled to a plurality of wordlines, and further wherein during programming of one of said memory devices a first programming potential is coupled to the wordline of said one of said memory devices, said array including at least one reference device used in reading the state of said one of said memory devices, said at least one reference device having an electrically floating gate for storing a charge, wherein said at least one reference device is coupled to at least one of said plurality of wordlines and has first and second regions, and further wherein said reference device is subject to said programming potential during programming of said one of said memory devices, such that said programming potential is applied to said floating gate of said at least one reference device, an improvement comprising:

a switch coupled to the first region of said at least one reference device for decoupling said first region of said at least one reference device from a first potential supplied during reading of said one of said memory devices, and coupling said first region of said at least one reference device to a second potential when said programming potential is applied to said at least one of said plurality of wordlines, said second potential being selected so as to prevent charge accumulation on the gate of said at least one reference device, wherein said charge accumulation is attributable to repeated application of the programming potential to said at least one of said plurality of wordlines during multiple programming cycles.

2. The improvement defined by claim 1 wherein said at least one reference device comprises a transistor, wherein said first region of said at least one reference device is the source region of said transistor.

3. The improvement defined by claim 2 wherein said first potential is ground potential.

4. The improvement defined by claim 3 wherein said second potential is approximately 3.5 volts.

5. The improvement defined by claim 3 wherein said at least one reference device has same device structure and size as said one of said memory devices.

6. An electrically programmable read-only memory comprising:

a plurality of memory devices arranged as an array, wherein each of said plurality of memory devices includes an electrically floating gate and first and second regions, and wherein said plurality of memory devices are arranged in a plurality of rows;

a plurality of wordlines coupled to the floating gate of each of said plurality of memory devices in each of said plurality of rows;

at least one reference device used in reading the state of one of said plurality of memory devices, said at least one reference device having an electrically floating gate and first and second regions, and wherein the electrically floating gate of said at least one reference device stores a charge and is coupled to said at least one of said plurality of wordlines, wherein a first potential is applied to at least one of said plurality of wordlines to program one of said plurality of memory devices coupled to said at least one of said plurality of wordlines, such that the first potential is applied to said one of said plurality of memory devices, a second potential is applied to the second region of said one of said plurality of memory devices and a third potential is applied to the first region of said one of said plurality of memory devices to program said one of said plurality of memory devices, wherein said second potential is a positive potential, wherein said first potential is applied to said floating gate of said at least one reference device during programming of said one of said plurality of memory devices, such that said first potential affects said charge on the floating gate of said at least one reference device during programming;

a switch coupled to the first region of said at least one reference device for decoupling the first region of said at least one reference device from a fourth potential supplied during reading of said one of the plurality of memory devices and coupling said first region of said at least one reference device to a fifth potential when said first potential is applied to said at least one of said plurality of wordlines during programming, said fifth potential being selected so as to prevent charge accumulation on the gate of said at least one reference device, wherein said charge accumulation is attributable to repeated application of the first potential to said at least one plurality of wordlines during multiple programming cycles wherein said fifth potential is not equal to said third potential.

7. The memory defined in claim 6 wherein said at least one reference device comprises a transistor, wherein said first region of said reference device is the source region of said at least one reference device.

8. The memory defined by claim 6 wherein said fourth potential is ground potential.

9. The memory defined by claim 8 wherein said fifth potential is approximately 3.5 volts.

10. The memory defined by claim 8 wherein said at least one reference device has the same device structure and size as said one of said plurality of memory devices.

11. The memory defined by claim 10 wherein said at least one reference device comprises a plurality of reference cells, wherein each of said plurality of reference cells is coupled to one of said plurality of wordlines, and wherein said fifth potential is selected to prevent erasing of each of said plurality of references cells not coupled to said at least one of said plurality of wordlines and to prevent charging of said at least one reference device during programming of said one of said plurality of memory devices.

12. The memory defined by claim 6 wherein the switch includes means for preventing bootstrapping.

13. An electrically programmable read-only memory comprising:

a plurality of memory devices arranged as an array, wherein each of said plurality of memory devices includes an electrically floating gate and source and drain regions, and wherein said plurality of memory devices are arranged in a plurality of rows;

a plurality of wordlines coupled to the floating gate of each of said plurality of memory devices in each of said plurality of rows;

at least one reference device used in reading the state of said one of said plurality of memory devices, said at least one reference device having an electrically floating gate and source and drain regions structured and sized the same as that of each of said plurality of memory devices, and wherein the electrically floating gate of said at least one reference device stores a charge and is coupled to said at least one of said plurality of wordlines, wherein a first potential is applied to said at least one of said plurality of wordlines to program one of said plurality of memory devices coupled to said at least one of said plurality of wordlines, such that the first potential is applied to said one of said plurality of memory devices, a second potential is applied to the drain region of said one of said plurality of memory devices and a third potential is applied to the source region of said one of said plurality of memory devices to program said one of said plurality of memory devices, wherein said second potential is a positive potential and said third potential is ground potential, and wherein said first potential is applied to said floating gate of said at least one reference device during programming of said one of said plurality of memory devices, such that said first potential affects said charge on the floating gate of said at least one reference device during programming of said one of said plurality of memory devices;

a switch coupled to the source region of said at least one reference device for decoupling the source region of said at least one reference device from a fourth potential supplied during reading of said one of the plurality of memory devices and coupling said source region of said at least one reference device to a fifth potential during programming when said first potential is applied to said at least one of said plurality of wordlines said fifth potential being selected so as to prevent charge accumulation on the gate of said at least one reference device, wherein said charge accumulation is attributable to repeated application of the first potential to said at least one plurality of wordlines during multiple programming cycles wherein said fifth potential is not equal to said third potential.

14. The memory defined by claim 13 wherein said fifth potential is approximately 3.5 volts.

15. The memory defined by claim 13 wherein the switch includes means for preventing bootstrapping.

16. An electronically programmable read-only memory comprising:

a plurality of memory devices arranged as an array, wherein each of said plurality of memory devices includes an electrically floating gate and source and drain regions, and wherein said plurality of memory devices are arranged in a plurality of rows;

a plurality of wordlines coupled to the floating gate of each of said plurality of memory devices in each of said plurality of rows;

a plurality of reference devices, each of said plurality of reference devices coupled to a distinct one of said plurality of wordlines, each of said plurality of reference devices used in reading the state of said plurality of memory devices coupled to its respective wordline, each of said plurality of reference devices having an electrically floating gate and source and drain regions, and wherein the electrically floating gate of each of said reference devices stores a charge, wherein a first potential is applied to said at least one of said plurality of wordlines to program one of said plurality of memory devices coupled to said at least one of said plurality of wordlines, such that the first potential is applied to said one of said plurality of memory devices, a second potential is applied to the drain region of said one of said plurality of memory devices and a third potential is applied to the source region of said one of said plurality of memory devices to program said one of said plurality of memory devices, wherein said second potential is a positive potential and said third potential is ground potential, and wherein said first potential is applied to said floating gate of said at least one reference device during programming of said one of said plurality of memory devices, such that said first potential affects said charge on the floating gate of said at least one reference device during programming of said one of said plurality of memory devices; and a switch coupled to the source region of said at least one reference device for decoupling the source region of said at least one reference device from a fourth potential supplied during reading of said one of the plurality of memory devices and coupling said source region of said at least one reference device to a fifth potential during programming when said first potential is applied to said at least one of said plurality of wordlines, said fifth potential being selected so as to prevent charge accumulation on the gate of said at least one reference device and to prevent the plurality of reference devices that are not coupled to said one of said plurality of wordlines from erasing when said programming potential is applied to said at least one plurality of wordlines during multiple programming cycles wherein said fifth potential is not equal to said third potential.

17. The memory defined by claim 16 wherein said fifth potential is approximately 3.5 volts.

* * * * *